US012663464B2

(12) United States Patent
    Kaneda

(10) Patent No.: US 12,663,464 B2
(45) Date of Patent: Jun. 23, 2026

(54) SEMICONDUCTOR INTEGRATED CIRCUIT DEVICE AND VEHICLE

(71) Applicant: ROHM CO., LTD., Kyoto (JP)

(72) Inventor: Yuji Kaneda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/524,331

(22) Filed: Nov. 30, 2023

(65) Prior Publication Data

US 2024/0201250 A1     Jun. 20, 2024

(30) Foreign Application Priority Data

Dec. 14, 2022     (JP) ................................. 2022-199611

(51) Int. Cl.
    *G01R 31/28*        (2006.01)
    *G01R 33/07*        (2006.01)
    *B60R 16/023*       (2006.01)

(52) U.S. Cl.
    CPC ..... *G01R 31/2884* (2013.01); *G01R 31/2829* (2013.01); *G01R 31/2836* (2013.01); *G01R 33/07* (2013.01); *B60R 16/0231* (2013.01)

(58) Field of Classification Search
    CPC .. E05F 15/40; E05F 2015/487; G01R 15/202; G01R 31/2829; G01R 31/2836; G01R 31/2851; G01R 31/2879; G01R 31/2884; G01R 33/07
    See application file for complete search history.

(56) References Cited

U.S. PATENT DOCUMENTS

| | | | | |
|---|---|---|---|---|
| 5,477,135 A * | 12/1995 | Baker | .................. | G01R 15/202 |
| | | | | 324/130 |
| 6,014,091 A * | 1/2000 | Noltemeyer | ....... | G01R 31/2829 |
| | | | | 341/15 |
| 6,114,856 A * | 9/2000 | Bitts | .................. | G01R 31/2829 |
| | | | | 324/522 |
| 2006/0056500 A1* | 3/2006 | Motz | .................. | G01R 31/2829 |
| | | | | 375/224 |
| 2006/0232393 A1* | 10/2006 | Kimura | ................... | F16H 61/32 |
| | | | | 340/456 |
| 2014/0143074 A1* | 5/2014 | Kolls | ..................... | G06Q 20/18 |
| | | | | 705/16 |
| 2018/0136999 A1* | 5/2018 | Fernandez | .......... | G06F 11/0739 |

FOREIGN PATENT DOCUMENTS

JP          2019-113390          7/2019

* cited by examiner

*Primary Examiner* — Levi Gannon
(74) *Attorney, Agent, or Firm* — Fish & Richardson P.C.

(57)          ABSTRACT

A semiconductor integrated circuit device with a signal processing circuit configured to process a received signal, includes: a failure detection circuit configured to detect a failure within the semiconductor integrated circuit device; and an output terminal, wherein if the failure is not detected by the failure detection circuit, an output signal of the signal processing circuit is output externally from the output terminal, and wherein if the failure is detected by the failure detection circuit, a command notifying details of the failure is output externally from the output terminal.

14 Claims, 5 Drawing Sheets

SEMICONDUCTOR INTEGRATED CIRCUIT DEVICE AND VEHICLE

CROSS-REFERENCE TO RELATED APPLICATION

This application is based upon and claims the benefit of priority from Japanese Patent Application No. 2022-199611, filed on Dec. 14, 2022, the entire contents of which are incorporated herein by reference.

TECHNICAL FIELD

The present disclosure relates to a semiconductor integrated circuit device and a vehicle using the same.

BACKGROUND

Various semiconductor integrated circuit devices have been developed in the related art.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the present disclosure, a Metal Oxide Semiconductor (MOS) field effect transistor refers to a field effect transistor having a gate structure of at least three layers consisting of a "layer made of a conductor or a semiconductor such as polysilicon with a low resistance value," an "insulating layer," and a "P-type, N-type, or intrinsic semiconductor layer." That is, the gate structure of the MOS field effect transistor is not limited to a three-layer structure of metal, oxide, and semiconductor.

In the present disclosure, a reference voltage refers to a voltage that is kept constant in an ideal state, and in practice, it refers to a voltage that may fluctuate slightly due to a change in temperature or the like.

Semiconductor Integrated Circuit Device

Figure 1:
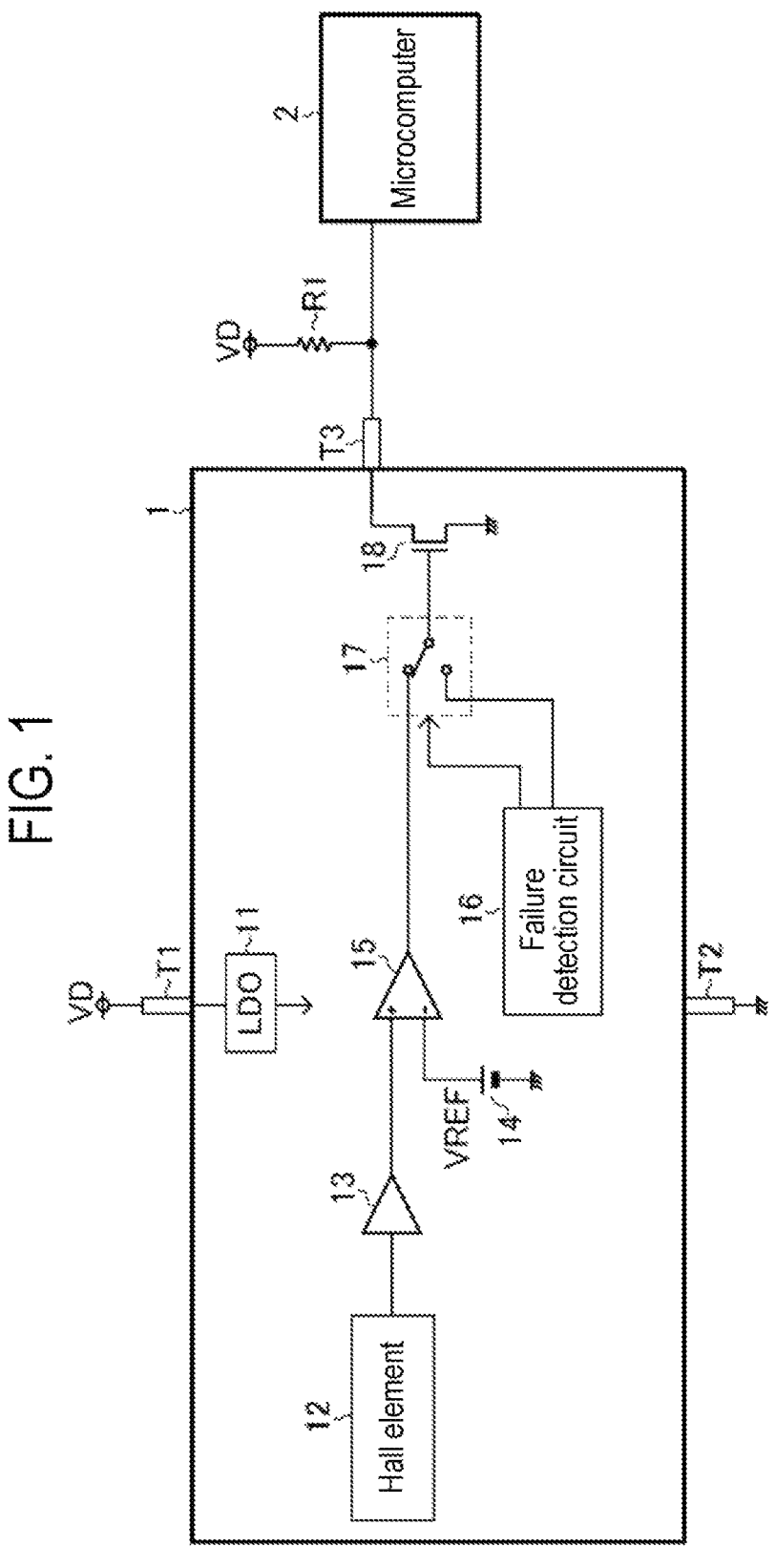
FIG. 1 is a diagram showing a schematic configuration example of a semiconductor integrated circuit device according to an embodiment of the present disclosure.

FIG. 1 is a diagram showing a schematic configuration example of a semiconductor integrated circuit device 1 according to an embodiment of the present disclosure. The semiconductor integrated circuit device 1 is a Hall Integrated Circuit (IC). The semiconductor integrated circuit device 1 includes a Low Drop Out (LDO) 11, a Hall element 12 which is an example of a sensor element, an amplifier 13, a reference voltage source 14, a comparator 15, a failure detection circuit 16, a switch 17, a driver 18, a power supply terminal T1, a ground terminal T2, and an output terminal T3. A circuit configured by the amplifier 13, the reference voltage source 14, the comparator 15, and the driver 18 is an example of a signal processing circuit that processes received signals. In this embodiment of the present disclosure, the signal processing circuit receives an output signal of the Hall element 12.

A positive voltage VD is applied to the power supply terminal T1, and a ground voltage is applied to the ground terminal T2.

The LDO 11 receives the voltage VD from the power supply terminal T1, steps down the voltage VD to generate a stabilized drive voltage, and supplies the drive voltage to each part in the semiconductor integrated circuit device 1.

The Hall element 12 outputs a magnetic field strength signal according to its surrounding magnetic field strength.

The amplifier 13 amplifies the magnetic field strength signal output from the Hall element 12 and supplies the magnetic field strength signal thereof to a non-inverting input terminal of the comparator 15. The reference voltage source 14 supplies a reference voltage VREF to an inverting input terminal of the comparator 15.

The comparator 15 outputs a comparison result between the magnetic field strength signal amplified by the amplifier 13 and the reference voltage VREF. Note that in this embodiment of the present disclosure, the comparator 15 is a hysteresis comparator.

The failure detection circuit 16 detects failures within the semiconductor integrated circuit device 1. More specifically, the failure detection circuit 16 detects failures of at least a part of the LDO 11, the Hall element 12, the amplifier 13, the reference voltage source 14, and the comparator 15. A failure detection range of the failure detection circuit 16 is not particularly limited. For example, the failure detection circuit 16 may detect failures of only the Hall element 12, or may detect failures of all of the LDO 11, the Hall element 12, the amplifier 13, the reference voltage source 14, and the comparator 15. It is desirable that the failure detection circuit 16 has a configuration that includes a coil and generates a magnetic field by making a current flow through the coil.

The switch 17 is controlled by the failure detection circuit 16. The switch 17 selects either a signal output from the comparator 15 or a signal output from the failure detection circuit 16 and supplies a signal thus selected to the driver 18. If no failure is detected by the failure detection circuit 16, the switch 17 selects the signal output from the comparator 15. On the other hand, if a failure is detected by the failure detection circuit 16, the switch 17 selects the signal output from the failure detection circuit 16. Also, when the switch 17 selects the signal output from the failure detection circuit 16, the driver 18 serves as an output stage of the signal processing circuit that processes the output signal of the Hall element 12. On the other hand, when the switch 17 selects the signal output from the failure detection circuit 16, the driver 18 does not function as a part of the signal processing circuit that processes the output signal of the Hall element 12.

The driver 18 is an open drain circuit composed of an N-channel MOS field effect transistor. A gate of the N-channel MOS field effect transistor receives a signal output from the switch 17. The ground voltage is applied to a source of the N-channel MOS field effect transistor. A drain of the N-channel MOS field effect transistor is connected to the output terminal T3. The signal output from the failure detection circuit 16 to the switch 17 includes a command that notifies details of the failure. A first end of a pull-up resistor R1 and a microcomputer 2 are connected to the output terminal T3. The voltage VD is applied to a second end of the pull-up resistor R1. Therefore, if no failure is detected by the failure detection circuit 16, the output signal of the signal processing circuit described above is externally output from the output terminal T3 and supplied to the microcomputer 2. On the other hand, if a failure is detected by the failure detection circuit 16, the command that notifies the details of the failure is externally output from the output terminal T3 and supplied to the microcomputer 2. Therefore, the semiconductor integrated circuit device 1 may notify the microcomputer 2 of the failure by using the command.

Figure 2:
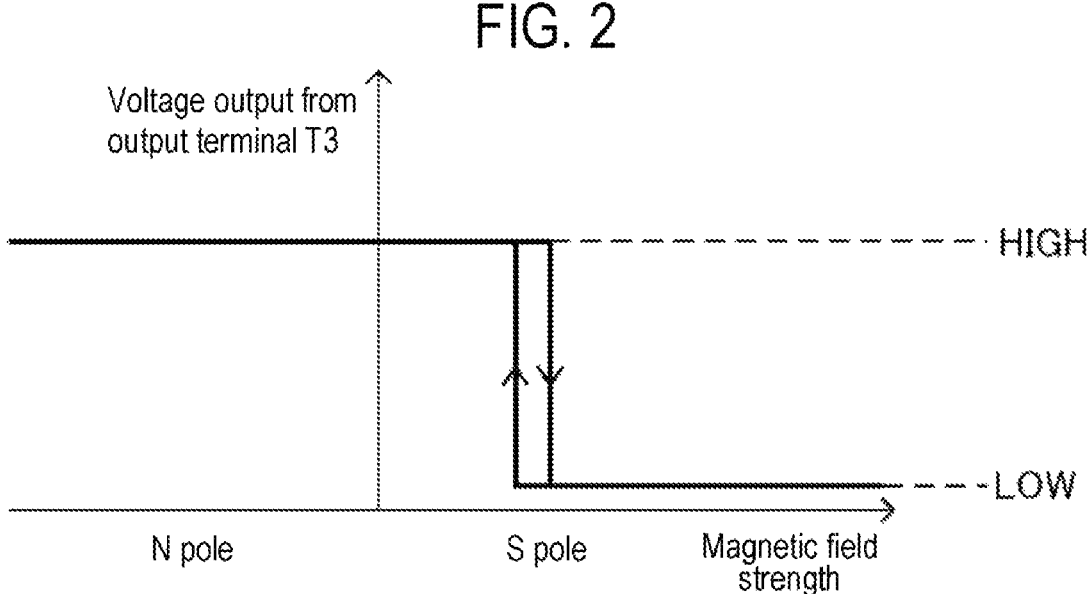
FIG. 2 is a diagram showing output characteristics of the semiconductor integrated circuit device according to the embodiment of the present disclosure.

FIG. 2 is a diagram showing output characteristics of the semiconductor integrated circuit device 1. A horizontal axis shown in FIG. 2 represents a magnetic field strength around the Hall element 12, and a vertical axis shown in FIG. 2 represents a voltage output from the output terminal T3. As is clear from the output characteristics shown in FIG. 2, the semiconductor integrated circuit device 1 is a Hall IC that detects a magnetic field caused by an S pole of a magnet. If the semiconductor integrated circuit device 1 has no failure, the driver 18 (N-channel MOS field effect transistor) is turned on and the voltage output from the output terminal T3 becomes a LOW level (ground voltage) when the S pole of the magnet approaches the semiconductor integrated circuit device 1. Further, if the semiconductor integrated circuit device 1 has no failure, the driver 18 (N-channel type MOS field effect transistor) is turned off and the voltage output from the output terminal T3 becomes a HIGH level (voltage VD) by the pull-up resistor R1 when the S pole of the magnet is separated from the semiconductor integrated circuit device 1.

Figure 3:
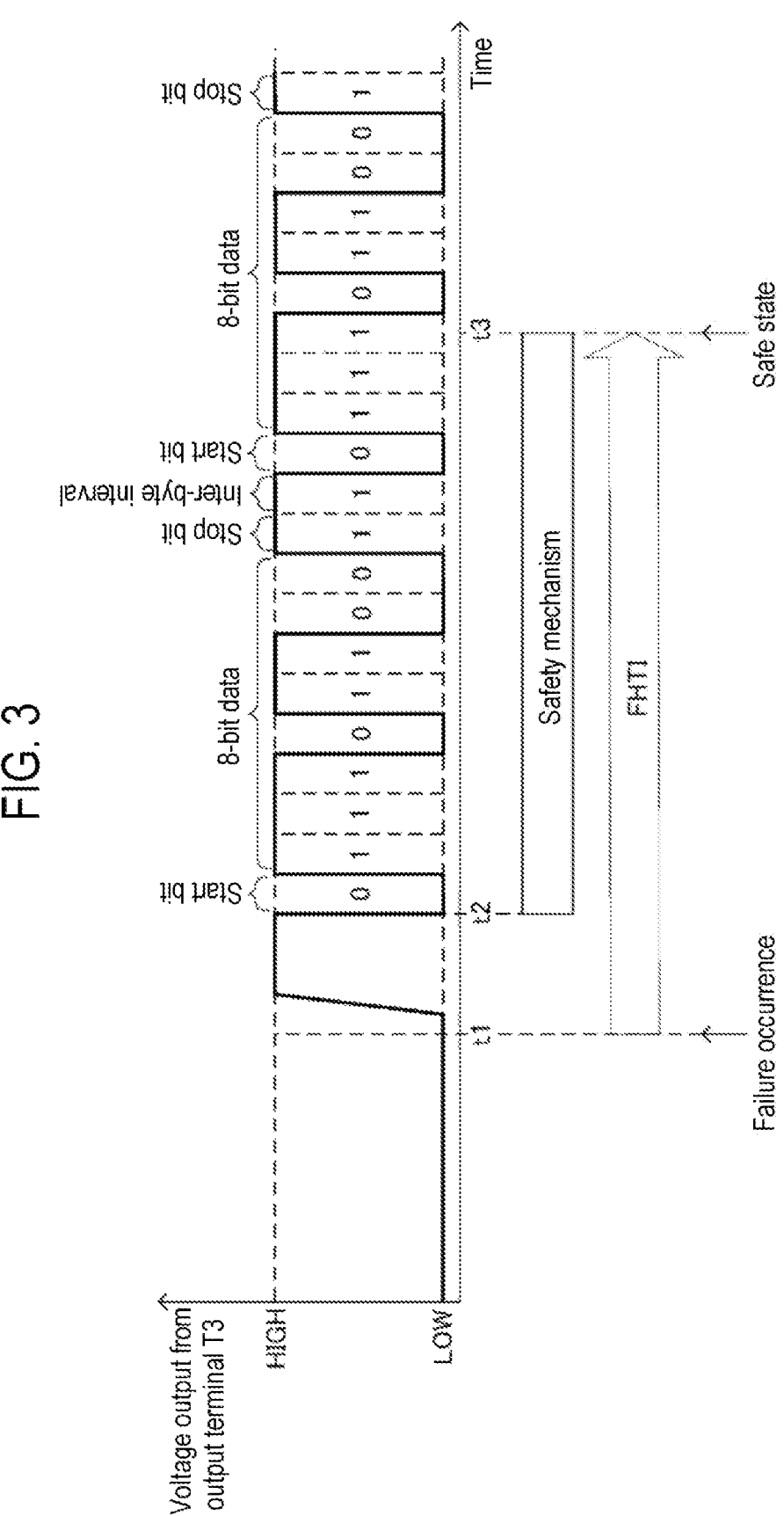
FIG. 3 is a diagram showing an example of changes in a voltage output from an output terminal.

FIG. 3 is a diagram showing an example of changes in the voltage output from the output terminal T3. Specifically, FIG. 3 shows an example of changes in the voltage output from the output terminal T3 when a failure occurs in the semiconductor integrated circuit device 1 in a state where the S pole of the magnet is approaching the semiconductor integrated circuit device 1.

Figure 4:
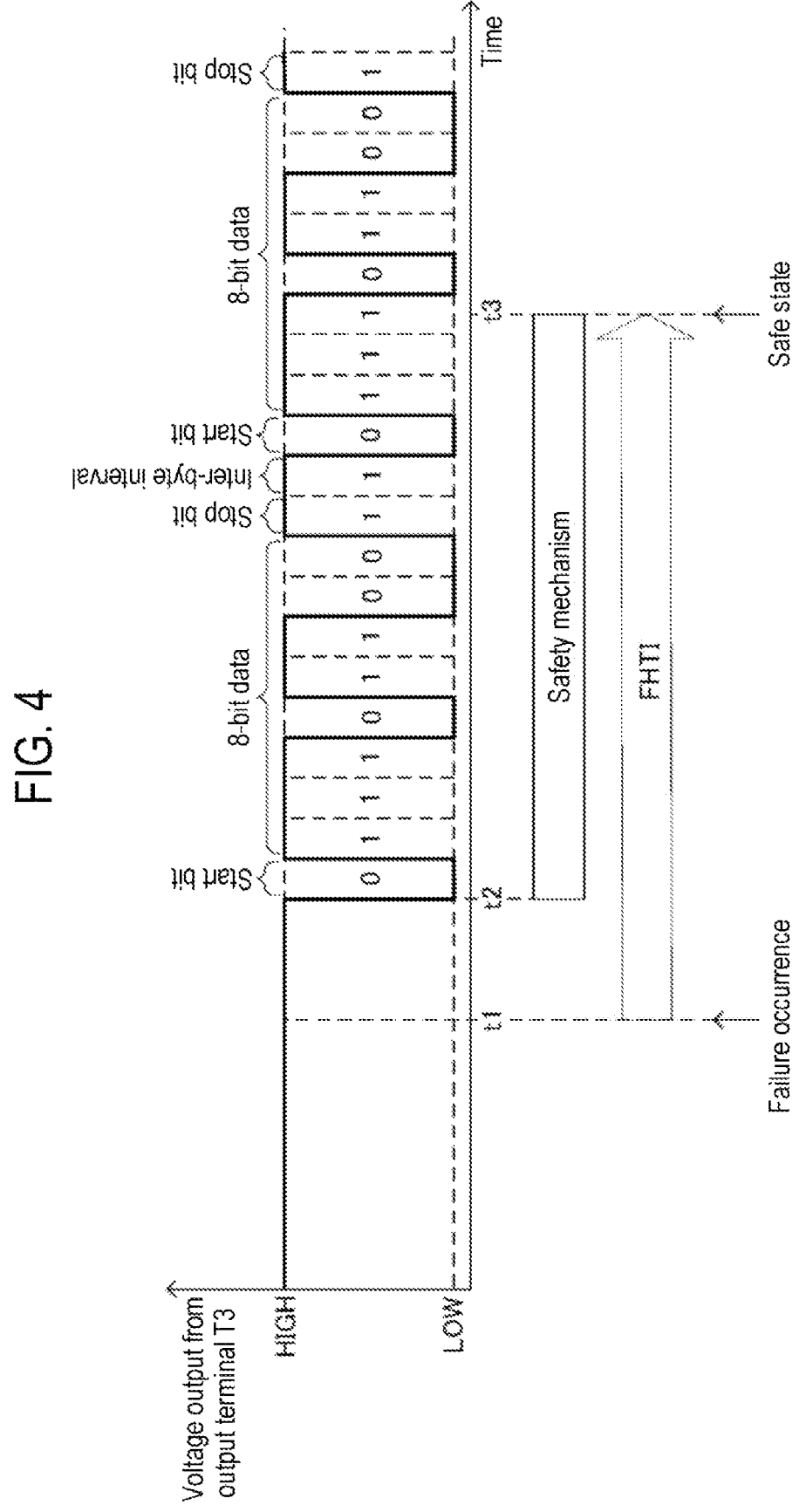
FIG. 4 is a diagram showing another example of changes in the voltage output from the output terminal.

FIG. 4 is a diagram showing another example of changes in the voltage output from the output terminal T3. Specifically, FIG. 4 shows an example of changes in the voltage output from the output terminal T3 when a failure occurs in the semiconductor integrated circuit device 1 in a state where the S pole of the magnet is being separated from the semiconductor integrated circuit device 1.

In the examples shown in FIGS. 3 and 4, the failure occurs at time t1, and a safety mechanism starts operating at time t2 when transmission of the command notifying the details of the failure begins. Then, at time t3 when the operation of the safety mechanism is completed, a system including the semiconductor integrated circuit device 1 and the microcomputer 2 transitions to a safe state (for example, system shutdown, etc.). A period from time t1 to time t3 is a Fault Handling Time Interval (FHTI).

In the examples shown in FIGS. 3 and 4, a command of a Universal Asynchronous Receiver Transmitter (UART) format is used as the command notifying the details of the failure from the output terminal T3. Since the command of the UART format is a command of a legacy format, restrictions imposed on the microcomputer 2 may be reduced. For example, the microcomputer 2 may receive the command of the UART format via a General Purpose Interface Bus (GPIB). Further, for example, the microcomputer 2 may receive the command of the UART format by using a UART receiver.

The command of the UART format consists of a start bit which is 0 (LOW level), an 8-bit data bit following the start bit, and a stop bit which is 1 (HIGH level) following the 8-bit data bit. Also, a parity bit may be provided between the 8-bit data bit and the stop bit.

The semiconductor integrated circuit device 1 may communicate the details of the failure to the microcomputer 2 by using the 8-bit data bit. In this embodiment of the present disclosure, the failure detection circuit 16 may vary the 8-bit data bit depending on the details of the failure detected.

Further, in the examples shown in FIGS. 3 and 4, the command notifying the details of the failure from the output terminal T3 is output externally from the output terminal T3 periodically. More specifically, the command notifying the details of the failure from the output terminal T3 is output externally from the output terminal T3 periodically with inter-byte intervals in between.

Since the command notifying the details of the failure from the output terminal T3 is transmitted multiple times, even if a first command transmission fails due to noise, there is a possibility that it is recovered by a second and subsequent command transmissions. In other words, with a configuration in which the command notifying the details of the failure from the output terminal T3 is output externally from the output terminal T3 periodically, it is possible to improve noise resistance regarding the command transmissions.

Further, in the examples shown in FIGS. 3 and 4, when the failure is detected by the failure detection circuit 16, the driver 18 (N-channel MOS field effect transistor) is turned off, and the output terminal T3 is temporarily placed in a high impedance state, after which the command notifying the details of the failure is output externally. This allows the microcomputer 2 to reliably recognize the start bit of the command of the UART format.

Further, in the examples shown in FIGS. 3 and 4, the high impedance state mentioned above is not instantaneous but maintained for a certain period of time. This allows the microcomputer 2 to more reliably recognize the start bit of the command of the UART format.

Applications

Figure 5:
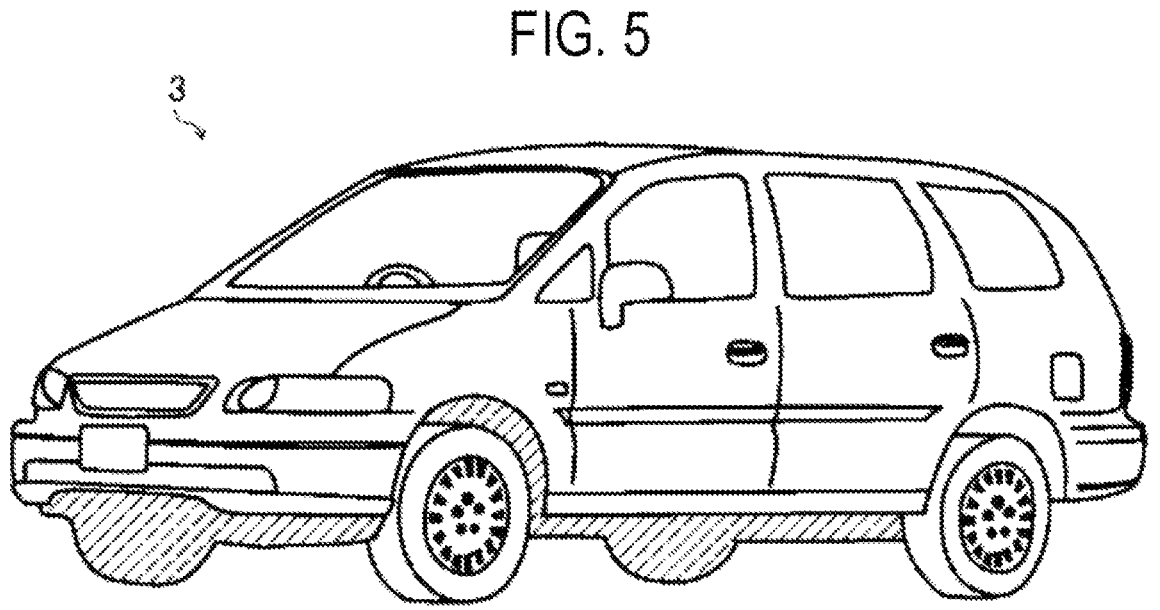
FIG. 5 is a diagram showing an external view of a vehicle.

The semiconductor integrated circuit device 1 is mounted together with the microcomputer 2 on a vehicle 3 shown in FIG. 5, for example. That is, the vehicle 3 includes the semiconductor integrated circuit device 1. When the vehicle 3 includes the semiconductor integrated circuit device 1, the semiconductor integrated circuit device 1 may function as a door opening/closing detection sensor by detecting an approach of a magnet provided on a door of the vehicle 3, for example.

Others

In addition to the above embodiment of the present disclosure, the configuration of the present disclosure may be modified in various ways without departing from the spirit of the present disclosure. The above embodiment should be considered to be illustrative and not restrictive in all respects, and it should be understood that the technical scope of the present disclosure is indicated by the claims rather than the description of the above embodiment and includes all modifications falling within the meaning and scope equivalent to the claims.

For example, in the above-described embodiment, the driver 18 is described as an open drain circuit, but it may also be the case that the driver 18 is an open collector circuit configured by an NPN bipolar transistor, a half bridge circuit configured by two transistors, or the like.

For example, in the above-described embodiment, the Hall element 12 is used as a sensor element, but it is also possible that sensor elements other than the Hall element 12 are used. Further, a signal received by the signal processing circuit is not limited to an output signal of the sensor element, and may be a signal other than the output signal of the sensor element.

For example, in the above-described embodiment, the command of the UART format is used as a legacy format command, but legacy format commands other than the command of the UART format may also be used.

The semiconductor integrated circuit device (1) described above has a configuration (first configuration) that includes: a signal processing circuit (13, 14, 15, and 18) configured to process the received signals; a failure detection circuit (16) configured to detect the failure within the semiconductor integrated circuit device; and an output terminal (T3), wherein if the failure is not detected by the failure detection circuit, an output signal of the signal processing circuit is output externally from the output terminal, and wherein if the failure is detected by the failure detection circuit, a command notifying details of the failure is output externally from the output terminal.

The semiconductor integrated circuit device of the first configuration may notify a subsequent stage circuit of the failure by using the command. Further, in the semiconductor integrated circuit device of the first configuration, a command of a legacy format may be used, so that restrictions imposed on the subsequent stage circuit may be reduced.

The semiconductor integrated circuit device of the first configuration may be further configured such that if the failure is detected by the failure detection circuit, the command is periodically output externally (second configuration).

The semiconductor integrated circuit device of the second configuration may improve noise resistance regarding the command transmissions.

The semiconductor integrated circuit device of the first or the second configuration may be further configured such that if the failure is detected by the failure detection circuit, the output terminal is temporarily placed in a high impedance state, and then the command is output externally (third configuration).

In the semiconductor integrated circuit device of the third configuration, when the command is a command of the UART format, for example, the subsequent stage circuit may reliably recognize a start bit of the command.

The semiconductor integrated circuit device of the third configuration may be further configured such that the high impedance state is maintained for a certain period of time (fourth configuration).

In the semiconductor integrated circuit device of the fourth configuration, for example, when the command is the command of the UART format, the subsequent stage circuit may more reliably recognize the start bit of the command.

The semiconductor integrated circuit device of any one of the first configuration to the fourth configuration may be further configured such that the signal processing circuit includes a driver connected to the output terminal, wherein the driver may be an open drain circuit or an open collector circuit (fifth configuration).

The semiconductor integrated circuit device of the fifth configuration may simplify the configuration of the driver.

The semiconductor integrated circuit device of the fifth configuration may be further configured such that the output terminal is externally connectable to a pull-up resistor (sixth configuration).

The semiconductor integrated circuit device of the sixth configuration may allow operating the driver normally.

The vehicle (3) described above has a configuration (seventh configuration) that includes the semiconductor integrated circuit device of any one of the first configuration to the sixth configuration.

In the vehicle of the seventh configuration, the semiconductor integrated circuit device may notify the subsequent stage circuit of the failure, and restrictions imposed on the subsequent stage circuit may be reduced.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor integrated circuit device, which includes a plurality of parts including a signal processing circuit configured to process a received signal, comprising:
   a failure detection circuit configured to detect a failure within each of the plurality of parts; and
   an output terminal,
   wherein if the failure is not detected by the failure detection circuit, an output signal of the signal processing circuit is output externally from the output terminal,
   wherein if the failure is detected by the failure detection circuit, a command notifying details of the failure is output externally from the output terminal, the command varying in accordance with which part among the plurality of parts the failure is detected in, and
   wherein a command of a Universal Asynchronous Receiver Transmitter (UART) format is used as the command notifying the details of the failure from the output terminal.

2. The semiconductor integrated circuit device of claim 1, wherein if the failure is detected by the failure detection circuit, the command is periodically output externally.

3. The semiconductor integrated circuit device of claim 1, wherein if the failure is detected by the failure detection circuit, the output terminal is temporarily placed in a high impedance state, and then the command is output externally.

4. The semiconductor integrated circuit device of claim 3, wherein the high impedance state is maintained for a certain period of time.

5. The semiconductor integrated circuit device of claim 1, wherein the signal processing circuit includes a driver connected to the output terminal, and
   wherein the driver is an open drain circuit or an open collector circuit.

6. The semiconductor integrated circuit device of claim 5, wherein the output terminal is configured to be externally connectable to a pull-up resistor.

7. A vehicle comprising: a semiconductor integrated circuit device of claim 1.

8. A semiconductor integrated circuit device, which includes a plurality of parts including a signal processing circuit configured to process a received signal, comprising:

a failure detection circuit configured to detect a failure within each of the plurality of parts; and an output terminal, wherein if the failure is not detected by the failure detection circuit, an output signal of the signal processing circuit is output externally from the output terminal, wherein if the failure is detected by the failure detection circuit, a command notifying details of the failure is output externally from the output terminal, the command varying in accordance with which part among the plurality of parts the failure is detected in, and wherein the command notifying the details of the failure consists of a start bit that is a low level, eight data bits following the start bit, and a stop bit that is a high level following the eight data bits.

9. The semiconductor integrated circuit device of claim 8, wherein the command notifying the details of the failure further includes a parity bit between the eight data bits and the stop bit.

10. The semiconductor integrated circuit device of claim 8, wherein the failure detection circuit is configured to vary the eight data bits based on the details of the failure.

11. The semiconductor integrated circuit device of claim 8, wherein if the failure is detected by the failure detection circuit, the command is periodically output externally.

12. The semiconductor integrated circuit device of claim 8, wherein if the failure is detected by the failure detection circuit, the command notifying the details of the failure from the output terminal is output externally from the output terminal periodically with inter-byte intervals in between.

13. The semiconductor integrated circuit device of claim 8, wherein if the failure is detected by the failure detection circuit, the output terminal is temporarily placed in a high impedance state, and then the command is output externally.

14. The semiconductor integrated circuit device of claim 13, wherein the high impedance state is maintained for a certain period of time.

\* \* \* \* \*